United States Patent [19]

DiBugnara

[11] 4,243,427
[45] Jan. 6, 1981

[54] HIGH CONCENTRATION PHOSPHORO-SILICA SPIN-ON DOPANT

[75] Inventor: Raymond DiBugnara, Huntington Beach, Calif.

[73] Assignee: TRW Inc., Los Angeles, Calif.

[21] Appl. No.: 853,345

[22] Filed: Nov. 21, 1977

[51] Int. Cl.³ .............................................. H01L 21/22
[52] U.S. Cl. .................................... 106/287.16; 106/74; 106/287.17; 106/287.29; 148/188; 148/22; 252/950; 427/85; 427/93; 427/240
[58] Field of Search .................... 427/85, 93, 126, 240; 252/950; 148/188, 22; 106/74, 287.16, 287.17, 287.29

[56] References Cited

U.S. PATENT DOCUMENTS

| | | | |
|---|---|---|---|
| 3,486,951 | 12/1969 | Norby | 148/188 |
| 3,789,023 | 1/1974 | Ritchie | 148/188 |
| 3,834,939 | 9/1974 | Beyer et al. | 427/85 |
| 3,841,927 | 10/1974 | Florence et al. | 148/188 |
| 3,915,766 | 10/1975 | Pollack et al. | 148/188 |
| 3,998,668 | 12/1976 | Florence et al. | 148/188 |

OTHER PUBLICATIONS

Mellor, "A Comprehensive Treatise on Inorganic and Theoretical Chemistry," vol. V, pp. 362, 363, ©1924.

*Primary Examiner*—John D. Smith
*Attorney, Agent, or Firm*—Martin R. Horn

[57] ABSTRACT

A coating composition useful for forming a high concentration phosphoro-silica spin-on dopant is disclosed. The coating composition is formed by the steps of heating a solution of mono-aluminum phosphate, adding a methyl alcohol to the hot solution so as to decrease the viscosity to a predetermined level, permitting the now diluted mono-aluminum phosphate solution to cool and mixing the cooled solution with an alcoholic solution of tetraethylorthosilicate. The present invention is also directed to semiconductor devices coated with the coating composition described hereinabove.

6 Claims, 2 Drawing Figures

HIGH CONCENTRATION PHOSPHORO-SILICA SPIN-ON DOPANT

BACKGROUND OF THE INVENTION

1. Field of the Invention

The present invention relates generally to the field of dopant compositions and methods for producing high concentration phosphoro-silica dopants on a semiconductor device.

2. Prior Art

The fabrication of alloyed semiconductor devices is extremely well known in the semiconductor art. The problems raised by the prior art techniques and which have not been solved relate to the creation of an abundant source of phosphorus so as to allow deep diffusion in the semiconductor devices for doping purposes. In the prior art, there was no effective way to do the N+ drive especially in Hexa-mesa rectifiers. This was thought to be due to the fact that the N+ drive generally employs pyrolytic decomposition depositions.

Before describing the present invention, and in terms of the background of this area of endeavor, a brief discussion of the formation of any semiconductor device will be set forth. Semiconductors have been used for many years. The term "semiconductor device" as used herein, is used in its generic sense to include a number of materials such as the well known silicon-type semiconductor. Generally, such semiconductor devices are in the form of a wafer or disc of varying shapes. Silicon is one preferrable semiconductor material in that it is characterized by having a relatively wide gap at the top of its valence band and the bottom of its conduction band. This property of silicon makes possible stable electron operation at relatively high temperature and also results in low currents across a P-N junction region.

As is well recognized in the semiconductor art, a region of semiconductor material containing an excess of donor impurities and yielding an excess of free electrons, is considered to be an impurity doped N-type region. An impurity doped P-type region is one containing an excess of acceptor impurities resulting in a deficiency of electrons or an excess of holes. Therefore, an N-type material is one characterized by electron conduction whereas a P-type material is one characterized by a hole concentration. As used herein, and as well recognized in the art, when a semiconductor device has N-type region adjacent to a P-type region, the boundary between them is termed a P-N or N-P junction.

The present invention is concerned with a P- or N-type semiconductor device in which a N-type region is formed by a phosphorus containing layer. In the past, semiconductor devices containing a diffused P-N junction have been made by heating P-type silicon chips or wafers in the presence of a phosphorus compound such as phosphorus pentoxide. The phosphorus pentoxide is believed to form a glassy film over the surface of the wafer and subsequently, with continued heating, elemental phosphorus diffuses into the silicon. The prior art also discloses methods in which the phosphorus is deposited on the surface of the silicon wafer at low temperature and then heated to a temperature at which diffusion will take place.

While various developments have taken place in the prior art to effect the doping of semiconductor material by addition of dopant impurities, they all suffer from various shortcomings. One specific shortcoming is the fact that the diffusion of the phosphorus into the semiconductor device is generally very shallow. One such method involving deposition of a dopant is described in U.S. Pat. No. 3,287,187. The method disclosed therein requires the deposition of an oxide of the semiconductor material by vapor deposition followed by diffusion of the doping substance into the semiconductor surface by heating the semiconductor body. Yet another method of diffusing phosphorus into a semiconductor device is described in U.S. Pat. No. 3,998,668. In that patent, the source of phosphorus is provided by high purity aluminum metaphosphate. The aluminum metaphosphate functions as a source for the controlled release of phosphorus pentoxide vapors which are directed to the desired face of the silicon wafer. The method therefore requires the heating of the aluminum metaphosphate so as to produce the phosphorus pentoxide vapors. After the vapors react with a heated silicon surface, elemental phosphorus diffuses into the silicon chip with continued heating. Other related patents discussing various methods of providing a semiconductor with a phosphorus-containing composition include U.S. Pat. Nos. 3,607,467; 3,697,334; 3,510,369; and 2,974,073. As discussed hereinabove each of those above identified patents contains significant shortcomings in the manner in which the phosphorus composition is applied to the semiconductor device. The present invention contains none of the above identified shortcomings and provides a composition which can be used to provide an abundant source of phosphorus so as to permit deep diffusion in a semiconductor device.

BRIEF SUMMARY OF THE INVENTION

The present invention relates to providing an abundant source of phosphorus in semiconductor devices. One source of phosphorus which, when presented in specific compositions, has been found to provide such abundant sources of phosphorus, is mono-aluminum phosphate. This ingredient is applied to the semiconductor device in the form of a specific composition which enables the phosphorus to be fully released during the diffusion process. In this manner, an abundant source of phosphorus for deep diffusion with no reabsorption of phosphorus back into the glass formed, and no release of aluminum, is achieved.

The coating composition of the present invention is a two-part composition. The first part is formed by heating a mono-aluminum phosphate solution. While the solution is still hot, methyl alcohol is added in order to lower the viscosity. The second composition is prepared by mixing tetraethylorthosilicate (hereinafter referred to as "TEOS") with methyl alcohol. When it is desired to form the coating composition, one part by volume of each of the above mixtures are blended together so as to form the ultimate coating composition. The coating composition is then spun onto a silicon wafer as is well known to the art and is heated so as to cross-link the solution, and more specifically, the TEOS, thereby forming an aluminum phosphorus dopant glass. Deep diffusion can then be performed using well known techniques with the dopant glass acting as the source of phosphorus.

The novel features which are believed to be characteristic of the invention, both as to its organization and method of operation, together with the further objectives and advantages thereof, will be better understood from the following description considered in connection with the accompanying drawings in which the presently preferred embodiment of the invention is illustrated by way of example. It is to be expressly understood, however, that the drawings are for the purpose of illustration and description only, and are not intended as a definition of the limits of the invention.

DETAILED DESCRIPTION OF THE INVENTION

Figure 1:
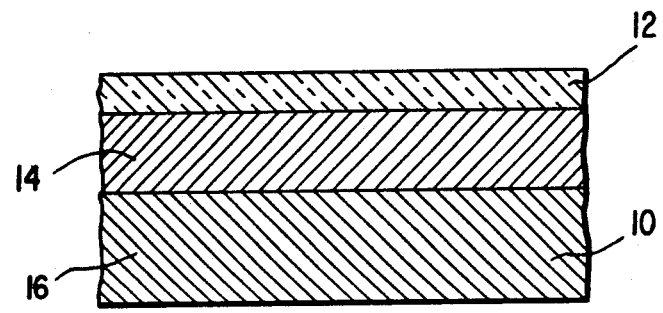
FIG. 1 is a sectional view showing a typical semiconductor device having a P-N junction and coated with the dopant of the present invention.

Referring first to FIG. 1, thereas shown as the present preferred embodiment, a semiconductor chip 10 having a dopant 12 disposed on the top surface thereof. Such semiconductor chips are usually made of silicon, as is the case of the preferred embodiment of the present invention. Of course it is understood that a wide variety of other semiconductor materials are within the scope of this invention. Dopant 12, which has been applied to the semiconductor device 10 as hereinafter described forms the upper N-region 14 such that a P-N junction is formed between the upper region 14 and the lower region 16. The method in which the dopant 12 is formed on the semiconductor device 10 will now be discussed.

As presented herein, many problems existed with the techniques used to supply elemental phosphorus to a semiconductor device. In fact, in many instances N+ drive could hardly be achieved at all. The present system permits one side of the device 10 to be phosphorus doped while the other side receives no counter-doping. This system therefore requires no special furnace or equipment as was the case in many prior art methods. This present method is straightforward and is keynoted by a lack of complexity in that all diffusions are done in oxygen.

These and other advantages are achieved by the use of a specific coating compositions. Without being limited to any specific composition, an example of one such composition is presented hereinbelow.

PART "A" MIXTURE 800 ml. of mono-aluminum phosphate aqueous solution are heated until the volume is decreased to approximately 400 ml. Such heating is carefully controlled so that slow boiling is achieved. It has been found that boiling the mono-aluminum phosphate solution below 400 ml. may cause the solution to gel. Next, the solution is removed from the heat source and while still hot, but not at boiling temperatures, 400 ml. methyl alcohol is added under vigorous stirring conditions so as to decrease the viscosity. The amount of alcohol added being governed by the desired method of application and the specific viscosity is not a critical feature of the present invention. The solution is then covered and permitted to cool to room temperature. At room temperature, if necessary, methyl alcohol is again added if some of the solution has evaporated so that the volume is again 800 ml.

PART "B" MIXTURE 400 ml. of TEOS is added to 400 ml. methyl alcohol and mixed.

Part "A" and part "B" solutions can be stored separately for up to one year or until some precipitation is noted. Precipitation is not found to be a significant problem in the present invention, but has been noted to occur more readily when the bottle is not completely full. It is thus believed to be caused in some manner by the presence of air in the bottle.

In the preferred embodiment, mono-aluminum phosphate ($AlPO_4$) is provided in a stock solution containing approximately 50% by weight $AlPO_4$ and 50% by weight water. Trace amounts of phosphoric acid are also present. Such a solution can be purchased from Stauffer Chemical Company and has an initial vicosity of from 35 and 90 cps, specific gravity of 1.47. In its solubilized form, as specified by the Stauffer Chemical Company, the $AlPO_4$ 50% solution has the formula: $Al(H_2PO_4)_3 \cdot XH_2O$ (in aqueous solution). While the initial concentration of the $AlPO_4$ in the solution is not critical, after the solution is heated and water is driven off, the heated solution should contain about 60 to 90 wt. percent $AlPO_4$, and more preferably, 75 to 85 wt. percent $AlPO_4$. It has been found that at these higher concentrations, heating is necessary in order to insure that the $AlPO_4$ remains in solution. If the heated solution is allowed to cool prior to the addition of alcohol, precipitation and/or gelling can result.

In the formation of the Part A solution, it has been found that the amount of alcohol added is dependent upon the desired viscosity of the final coating composition to be formed. However, at least 25% by volume of alcohol is added to the heated $AlPO_4$ solution in order that sufficient fluidity in achieved. It should also be noted that the TEOS which forms the glass is aided in cross-linking by the use of the trace amounts of the phosphoric acid in the $AlPO_4$ solution. Of course, other acidic cross-linking agents are within the scope of the present invention.

With respect to the Part B solution, such solution should contain at least 10 wt. percent TEOS, and preferably from about 30 to 70 wt. percent.

FORMATION OF THE FINAL COATING COMPOSITION

Equal parts by volume of Part A and Part B are mixed together. A slight precipitate may be formed as well as cloudiness. Both, however, will disappear usually as a thin frost in the container. While the preferred embodiments uses a 1:1 ratio by volume of Part A and Part B, it has been found that 1:2 of A and B are also within the scope of this invention. Sufficient TEOS, must be present in the final coating composition such that a stable glass can be formed as hereinafter described.

Figure 2:
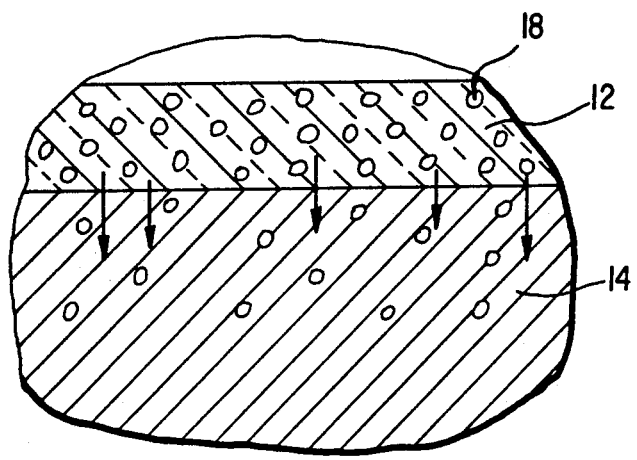
FIG. 2 is a magnified view of the interface between the dopant and the upper region of the semiconductor device shown in FIG. 1.

After the coating composition is formed, the solution is then spun onto a wafer as is well known in the art. Other forms for coating the wafer which are also within the scope of this invention, which include applying the composition by the means of a brush, spatula or like device. After the wafer is coated, it is heated to approximately 225 degrees centrigrade for 20 minutes so as to cross-link the solution and form an aluminum phosphorus glass. This cross-linked glass is now in a stable form and deep diffusion of the phosphorus in the glass can be performed at a later date by means well recognized in the art. In the preferred embodiment, the glass coated wafer 10, as shown in FIG. 1, is heated for approximately 16 hours at 1250 degrees C., such that elemental phosphorus 18 is caused to diffuse into the upper surface 14 of the wafer chip 10 as shown in FIG. 2. As discussed hereinabove, because there is an abundant source of phosphorus in the glass, deep diffusion of approximately 25–75 microns is achieved using the dopant of the present invention.

It should be understood that while the preferred examples described herein, deal with specific temperatures and compositions, other temperature ranges are clearly within the scope of the invention such that the cross-linking and/or diffusion is achieved. Further, other alcohols can be used in formation of the Part A and B solution. Among these are ethanol, butanol, isopropanol, and the like. Moreover, other components which do not materially alter these fundamental characteristics of the coating composition can be added thereto such as, for example, processing aids, thickening agents, etc. which are also within the scope of the present invention. Thus, it will be apparent to those skilled in the art, that other changes and modifications may be made without departing from spirit or scope of the present invention as defined and claimed herein.

What is claimed is:

1. A coating composition useful for forming a high concentration phosphoro-silica spin-on dopant, said composition formed by the steps of:
   (a) heating an aqueous solution of $Al(H_2PO_4)_3 \cdot XH_2O$;
   (b) adding at least 25 percent by volume of an alcohol to said hot solution;
   (c) permitting the $Al(H_2PO_4)_3 \cdot XH_2O$ alcohol solution to cool; and
   (d) mixing the solution formed from steps (a) through (c) with an alcohol solution of tetraethylorthosilicate so as to form said coating composition.

2. The coating composition according to claim 1 wherein said tetraethylorthosilicate is dissolved in methyl alcohol.

3. The coating composition according to claim 2 wherein the solution formed in steps (a) through (c) is mixed with an equal amount by volume of the methyl alcohol solution of tetraethylorthosilicate.

4. A two-part composition useful for forming a high concentration phophoro-silica spin-on dopant comprising:
   (a) a first solution of from about 60 to 90 wt. percent $Al(H_2PO_4)_3 \cdot XH_2O$ dissolved in an alcohol; and
   (b) a second solution of at least 10 wt. percent tetraethylorthosilicate dissolved in an alcohol.

5. The coating composition according to claim 4 wherein said first solution is formed by the steps of adding an alcohol to a heated aqueous solution of monoaluminum phosphate.

6. A coating composition according to claim 4 wherein from about 75 to 85 percent by weight of said first solution is $Al(H_2PO_4)_3 \cdot XH_2O$ and from about 30 to 70 wt. percent of said second solution is tetraethylorthosilicate.

* * * * *